(12) United States Patent
Son et al.

(10) Patent No.: US 8,638,621 B2
(45) Date of Patent: Jan. 28, 2014

(54) SEMICONDUCTOR MEMORY DEVICE HAVING A HIERARCHICAL BIT LINE SCHEME

(75) Inventors: Jong-pil Son, Seongnam-si (KR);
Chul-woo Park, Yongin-si (KR);
Young-hyun Jun, Seoul (KR);
Hong-sun Hwang, Suwon-si (KR);
Hak-soo Yu, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 42 days.

(21) Appl. No.: 13/413,938

(22) Filed: Mar. 7, 2012

(65) Prior Publication Data

US 2012/0230139 A1   Sep. 13, 2012

(30) Foreign Application Priority Data

Mar. 7, 2011   (KR) .......................... 10-2011-0019890

(51) Int. Cl.
*G11C 7/00*   (2006.01)
*G11C 11/419*   (2006.01)

(52) U.S. Cl.
CPC ................................... *G11C 11/419* (2013.01)
USPC ........... 365/190; 365/203; 365/205; 365/207; 365/196

(58) Field of Classification Search
CPC .......... G11C 11/4091; G11C 11/4097; G11C 11/4094; G11C 2207/002; G11C 7/08; G11C 7/12
USPC ............ 365/203, 205, 207, 190, 204, 210.12, 365/230.03
See application file for complete search history.

(56) References Cited

U.S. PATENT DOCUMENTS

| 2004/0037139 A1* | 2/2004 | Shimizu ........................ 365/203 |
| 2008/0130389 A1 | 6/2008 | Kajitani |
| 2008/0298150 A1 | 12/2008 | Takahashi |
| 2009/0257268 A1 | 10/2009 | Kajigaya |

FOREIGN PATENT DOCUMENTS

| JP | 2008-140529 | 6/2008 |
| JP | 2008-299893 | 12/2008 |
| KR | 1020090099490 | 9/2009 |

* cited by examiner

*Primary Examiner* — Thong Q Le
(74) *Attorney, Agent, or Firm* — F. Chau & Associates, LLC

(57) ABSTRACT

A semiconductor memory device including a bit line connected to a memory cell and a sense amplifier configured to drive a voltage level of a global bit line in response to a voltage level of the bit line. The sense amplifier provides data that is complementary to data stored in the memory cell to the global bit line and provides the complementary data of the global bit line to the memory cell during an active operation of the memory cell.

20 Claims, 7 Drawing Sheets

SEMICONDUCTOR MEMORY DEVICE HAVING A HIERARCHICAL BIT LINE SCHEME

CROSS-REFERENCE TO RELATED APPLICATION

This application claims priority under 35 U.S.C. §119 to Korean Patent Application No. 10-2011-0019890, filed on Mar. 7, 2011, in the Korean Intellectual Property Office, the disclosure of which is incorporated by reference herein in its entirety.

BACKGROUND

1. Technical Field

The inventive concept relates to a semiconductor memory device, and more particularly, to a semiconductor memory device having a hierarchical bit line scheme.

2. Discussion of the Related Art

Among semiconductor memory devices, a dynamic random access memory (DRAM) is used extensively, even though it requires a refresh cycle to sustain data within a predetermined refresh time. Efforts of research and development have been under way to produce a DRAM having a hierarchical bit line scheme with increased memory capacity, increased speed and reduced power consumption, while maintaining data integrity.

SUMMARY

The inventive concept provides a semiconductor memory device having a hierarchical bit line scheme by which a bit line is separated from a global bit line.

According to an exemplary embodiment of the inventive concept, there is provided a semiconductor memory device including a bit line connected to a memory cell and a sense amplifier configured to drive a voltage level of a global bit line in response to a voltage level of the bit line. The sense amplifier provides data that is complementary to data stored in the memory cell to the global bit line and provides the complementary data of the global bit line to the memory cell during an active operation of the memory cell.

The sense amplifier may include a first transistor having a gate connected to a precharge signal line, a drain connected to the bit line, and a source connected to a first voltage, a second transistor having a gate connected to the bit line, a drain connected to the global bit line, and a source connected to a selective power supply line, and a third transistor having a gate connected to a restoration signal line, a drain connected to the bit line, and a source connected to the global bit line.

The selective power supply line may be driven to a second voltage during a precharge operation and driven to the first voltage during a sensing operation. The first voltage may be a ground voltage, and the second voltage may be a power supply voltage.

The semiconductor memory device may further include a parity cell connected in common to a word line of the memory cell.

The semiconductor memory device may further include a parity sense amplifier connected to a bit line of the parity cell. The parity sense amplifier may provide data that is complementary to data stored in the parity cell to a parity global bit line and provide the complementary data of the parity global bit line to the parity cell during the active operation of the memory cell.

The parity cell may store predetermined data during an operation of writing data in the memory cell. When the data stored in the parity cell is the predetermined data, it may be determined that the data stored in the memory cell is true data, and when the data stored in the parity cell is not the predetermined data, it may be determined that the data stored in the memory cell is the complementary data.

According to an exemplary embodiment of the inventive concept, there is provided a semiconductor memory device including a plurality of sub-memory cell array blocks including a plurality of memory cells arranged at intersections between a plurality of word lines and a plurality of bit lines, a plurality of first sense amplifier blocks disposed between the sub-memory cell array blocks and including first sense amplifiers configured to drive voltage levels of global bit lines in response to voltage levels of the bit lines of respective sub-memory cell array blocks, and at least one second sense amplifier block including second sense amplifiers configured to sense and amplify the voltage levels of the global bit lines disposed across the sub-memory cell array blocks and the first sense amplifier blocks. Each of the first sense amplifiers may provide data that is complementary to data stored in a respective memory cell to the global bit line of the memory cell and provide the complementary data of the global bit line to the memory cell during an active operation of the memory cell.

At least one of the second sense amplifiers may transmit data provided to a write data line to the global bit line to which the second sense amplifier is connected during a write operation, and latch the voltage of the global bit line during a restoration operation.

At least one of the second sense amplifiers may include a first transistor configured to transmit the voltage of the global bit line to which the second sense amplifier is connected to a first node in response to a first sensing signal, a first inverter configured to receive the voltage from the first node and output an inverted voltage to a second node, a second inverter configured to receive the voltage from the second node and output an inverted voltage to a third node, a second transistor configured to transmit the voltage of the third node to the global bit line in response to a second sensing signal, a third transistor configured to connect the first node and a write data line in response to a write column selection signal, and a fourth transistor configured to connect the second node and a read data line in response to a read column selection signal.

At least one of the sub-memory cell array blocks may further include a parity cell connected to each of the word lines of the memory cells of the sub-memory cell array.

At least one of the first sense amplifier blocks may further include a first parity sense amplifier connected to a parity bit line of the parity cells and the first sense amplifier block is configured to provide data that is complementary to data stored in a first parity cell of the parity cells to a parity global bit line and provide the complementary data of the parity global bit line to the first parity cell during an access operation of a first memory cell to which the first parity cell is connected. In addition, the second sense amplifier block may further include a second parity sense amplifier configured to sense and amplify the voltage levels of the parity global bit line disposed across the at least one sub-memory cell array block and the at least one first sense amplifier block.

The semiconductor memory device may further include a precharge unit configured to precharge a global bit line to which the precharge unit is connected in response to a precharge signal.

The first parity cell may store preset data during an operation of writing data in the first memory cell.

The semiconductor device may determine that the data stored in the first memory cell is true data when the data stored in the parity cell is the preset data, and determine that the data stored in the first memory cell is the complementary data when the data stored in the parity cell is not the preset data.

The global bit lines may be divided into even global bit lines and odd global bit lines to drive the even global bit lines separately from the odd global bit lines.

At least one of the sub-memory cell array blocks may further include even parity cells connected to each of the word lines of first memory cells in the sub-memory cell array block and odd parity cells connected to each of the word lines of second memory cells in the sub-memory cell array block.

At least one of the first sense amplifiers may include a first transistor having a gate connected to a precharge signal line, a drain connected to a first bit line of the bit lines, and a source connected to a first voltage; a second transistor having a gate connected to the first bit line, a drain connected to a first global bit line of the global bit lines, and a source connected to a selective power supply line; and a third transistor having a gate connected to a restoration signal line, a drain connected to the first bit line, and a source connected to the first global bit line.

According to an exemplary embodiment of the inventive concept, there is provided a semiconductor memory device including: a memory cell connected to a bit line and a word line, wherein the bit line is separated from a global bit line; and a first sense amplifier configured to change a voltage level of the global bit line in response to a change in a voltage level of the bit line when the word line is enabled.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Hereinafter, exemplary embodiments of the inventive concept will be described in detail with reference to the accompanying drawings. This inventive concept may, however, be embodied in different forms and should not be construed as limited to the embodiments set forth herein. It will be understood that when a component is referred to as being "connected to" another component, it can be directly connected to the other component or intervening components may be present. Like numbers may refer to like elements throughout the drawings and specification. Certain aspects of the drawings may be exaggerated for clarity.

Figure 1:
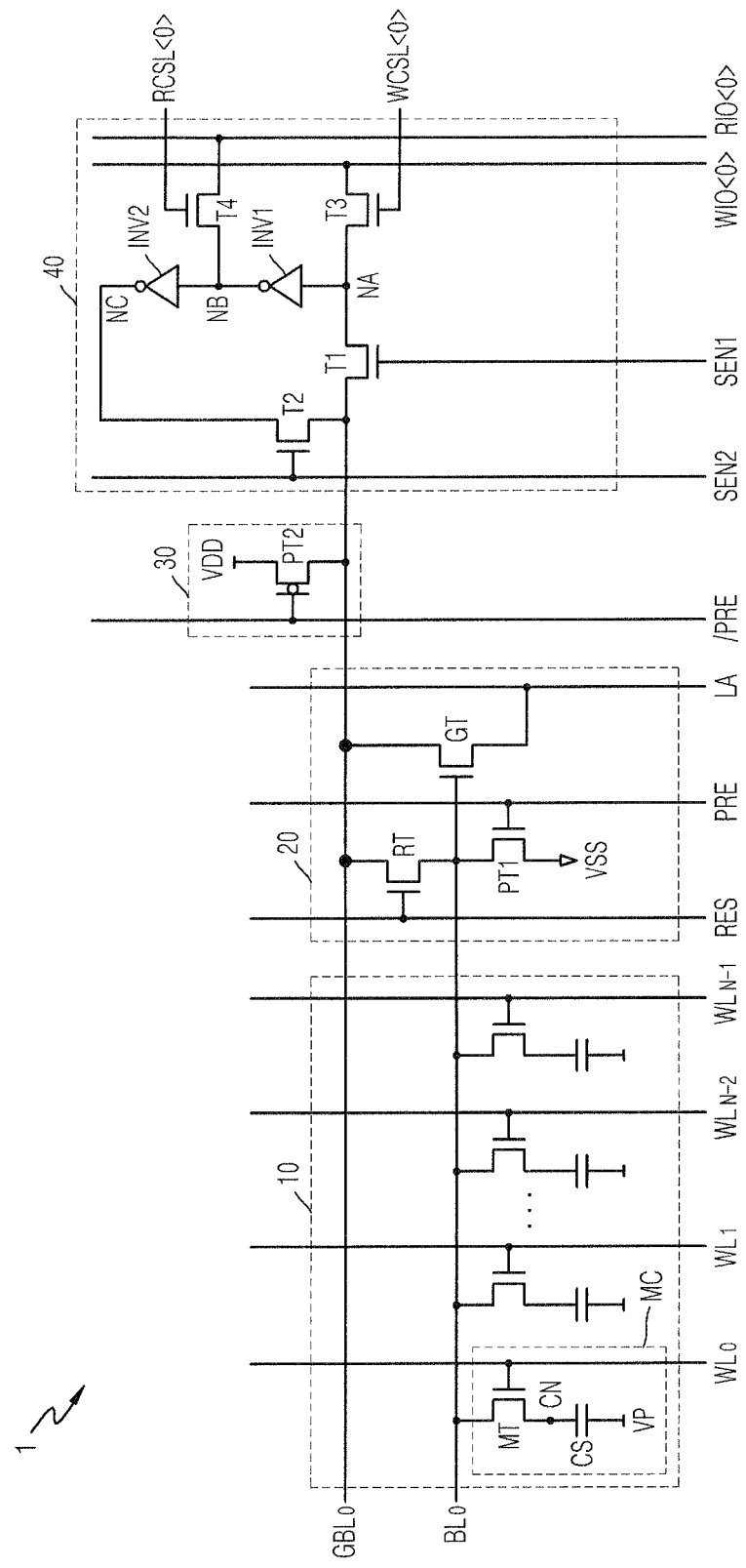
FIG. 1 is a diagram of a semiconductor memory device according to an exemplary embodiment of the inventive concept.

FIG. 1 is a diagram of a semiconductor memory device 1 according to an exemplary embodiment of the inventive concept.

Referring to FIG. 1, the semiconductor memory device 1 may include a memory cell array 10 having a hierarchical bit line scheme described hereinafter and first and second sense amplifiers 20 and 40 corresponding thereto. A plurality of memory cells MC are arranged in the memory cell array 10 and connected to intersections between a plurality of word lines $WL_0, WL_1, \ldots, WL_{N-2}, WL_{N-1}$ (N is a natural number) and a bit line $BL_0$. For ease of explaining a correlation between the bit line $BL_0$ and the first sense amplifier 20, only one bit line $BL_0$ is illustrated in the memory cell array 10 of FIG. 1. In an actual implementation, the memory cell array 10 may include a plurality of bit lines BLs (e.g., M bit lines BLs, where M is a natural number).

Each of the memory cells MC may include a single cell transistor MT and a single cell capacitor CS. The cell transistor MT may have a gate connected to the word line $WL_0$, a drain connected to the bit line $BL_0$, and a source connected to one terminal of the cell capacitor CS. The other terminal of the cell capacitor CS may be connected to a plate voltage VP. Memory cell data "0" or "1" may be stored in the cell capacitor CS. The bit line $BL_0$ of the memory cell MC may be connected to the first sense amplifier 20.

The first sense amplifier 20 may include three transistors, for example, a first precharge transistor PT1, a gain transistor GT, and a restoration transistor RT. The first sense amplifier 20 may act as a single-ended sense amplifier in which a gate of the gain transistor GT is connected to the bit line $BL_0$ of the memory cell MC.

The first precharge transistor PT1 may precharge the bit line $BL_0$ to a ground voltage VSS level during a precharge operation. The first precharge transistor PT1 may include an NMOS transistor having a gate connected to a line providing a first precharge signal PRE, a drain connected to the bit line $BL_0$, and a source connected to the ground voltage VSS. The first precharge signal PRE may be provided at a logic high level during the precharge operation.

The gain transistor GT may generate a voltage having a voltage level of a global bit line $GBL_0$ in response to a voltage level of the bit line $BL_0$ of a selected memory cell MC during an active operation. The active operation may refer to both sensing and restoration operations of the selected memory cell MC. The gate transistor GT may include an NMOS transistor having the gate connected to the bit line $BL_0$, a drain connected to the global bit line $GBL_0$, and a source connected to a selective power supply line LA. A different voltage may be transmitted to the selective power supply line LA according to a selection of the memory cell MC. For example, a power supply voltage VDD may be supplied to the selective power supply line LA during the precharge operation, while a ground voltage VSS may be applied to the selective power supply line LA during the sensing operation.

Figure 2:
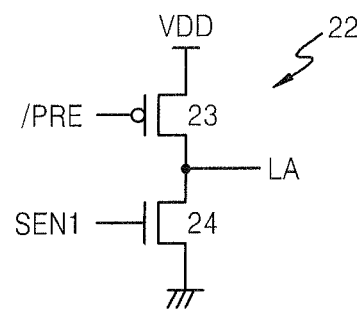
FIG. 2 is a diagram of a selective power driver configured to supply a voltage to a selective power line, according to an exemplary embodiment of the inventive concept.

FIG. 2 is a diagram of a selective power driver 22 configured to supply a voltage to the selective power supply line LA, according to an exemplary embodiment of the inventive concept.

Referring to FIG. 2, the selective power supply driver 22 may include a PMOS transistor 23 and an NMOS transistor 24. The PMOS transistor 23 may have a source connected to the power supply voltage VDD, a gate connected to a second precharge signal /PRE, and a drain connected to the selective power supply line LA. The NMOS transistor 24 may have a source connected to the ground voltage VSS, a gate connected to a first sensing signal SEN1, and a drain connected to the selective power supply line LA. The second precharge signal /PRE and the first precharge signal PRE may be complementary signals. The second precharge signal /PRE may be provided at a logic low level during a precharge operation. The first sensing signal SEN1 may be provided at a logic high level during a sensing operation.

The sensing operation will now be described with reference to FIG. 1. For example, in a case where data "1" is stored in a selected memory cell MC, when the word line $WL_0$ of the selected memory cell MC is enabled, the bit line $BL_0$ may perform a charge sharing operation and rise by as much as a read signal quantity $\Delta$ LBL from a precharged ground voltage VSS. When the read signal quantity $\Delta$ LBL becomes equal to or higher than a threshold voltage Vt of the gain transistor GT, the gain transistor GT may be turned on so that the ground voltage VSS can be transmitted from the selective power supply line LA to the global bit line $GBL_0$. Thus, the global bit line $GBL_0$ may be pulled down to a ground voltage VSS level.

In a case where data "0" is stored in a selected memory cell MC, when the word line $WL_0$ of the selected memory cell MC is enabled, the bit line $BL_0$ may remain at the precharged ground voltage VSS level. Thus, the gain transistor GT may remain turned off, while the global bit line $GBL_0$ may remain at the precharged power supply voltage VDD level. A precharge operation of the global bit line $GBL_0$ will be described below in connection to the operation of a precharge unit 30.

The restoration transistor RT may toggle and restore data of a selected memory cell MC during a restoration operation. The restoration transistor RT may include an NMOS transistor having a gate connected to a line providing a restoration signal RES, a drain connected to the bit line $BL_0$, and a source connected to the global bit line $GBL_0$. The restoration signal RES may be provided at a logic high level during the restoration operation.

The restoration operation will now be described. For instance, when data "1" is stored in a selected memory cell MC, the gain transistor GT may be turned on due to the read signal quantity $\Delta$ LBL of the bit line $BL_0$ connected to the selected memory cell MC so that the global bit line $GBL_0$ can reach a ground voltage VSS level. When the word line $WL_0$ of the selected memory cell MC is enabled and the restoration transistor RT is turned on in response to the logic-high restoration signal RES, a ground voltage VSS, for example, data "0", may be stored in the selected memory cell MC. In other words, the restoration operation may include toggling previous data "1" of the selected memory cell MC and restoring data "0".

When data "0" is stored in a selected memory cell MC, the global bit line $GBL_0$ may reach a power supply voltage VDD level. When the word line $WL_0$ of the selected memory cell MC is enabled and the restoration transistor RT is turned on in response to the logic-high restoration signal RES, the power supply voltage VDD, for example, data "1", may be stored in the selected memory cell MC. In other words, the restoration operation may include toggling previous data "0" of the selected memory cell MC and restoring data "1". The restoration operation of the selected memory cell MC will be described in further detail below in connection with the operation of the second sense amplifier 40.

The global bit line $GBL_0$ may be connected to the precharge unit 30 and the second sense amplifier 40. The precharge unit 30 may precharge the global bit line $GBL_0$ to the power supply voltage VDD level during the precharge operation. The precharge unit 30 may include a PMOS transistor PT2 having a gate connected to the second precharge signal /PRE, a drain connected to the global bit line $GBL_0$, and a source connected to the power supply voltage VDD.

During a read operation, the second sense amplifier 40 may sense a voltage of the global bit line $GBL_0$ and transmit the sensed voltage to a read data line RIO<0>. During a write operation, the second sense amplifier 40 may transmit data provided to a write data line WIO<0> to the global bit line $GBL_0$. In addition, during a restoration operation, the second sense amplifier 40 may latch the voltage of the global bit line $GBL_0$.

The second sense amplifier 40 may include a first transistor T1 configured to transmit the voltage of the global bit line $GBL_0$ to a first node NA in response to the first sensing signal SEN1. The first transistor T1 may have a source connected to the global bit line $GBL_0$, a gate connected to a line providing the first sensing signal SEN1, and a drain connected to the first node NA. A voltage of the first node NA may be input to a first inverter INV1, and an output of the first inverter INV1 may be connected to a second node NB. A voltage of the second node NB may be input to a second inverter INV2, and an output of the second inverter INV2 may be connected to a third node NC, which may be connected to a second transistor T2. The second transistor T2 may have a source connected to the third node NC, a gate connected to a line providing a second sensing signal SEN2, and a drain connected to the global bit line GBL0. The first and second sensing signals SEN1 and SEN2 may be provided at a logic high level during the active operation. The first node NA may be connected to a third transistor T3. The third transistor T3 may have a gate connected to a line providing a write column selection signal WCSL<0>, a drain connected to the first node NA, and a source connected to the write data line WIO<0>. The second node NB may be connected to a fourth transistor T4. The fourth transistor T4 may have a gate connected to a line providing a read column selection signal RCSL<0>, a source connected to the second node NB, and a drain connected to the read data line RIO<0>. The write column selection signal WCSL<0> and the read column selection signal RCSL<0> may be signals corresponding to a column address of a selected memory cell MC during a write or read operation and provided by a column decoder (not shown).

A read operation of the second sense amplifier 40 will now be described. For example, when data "1" is stored in a selected memory cell MC, the global bit line $GBL_0$ may reach a ground voltage VSS level. A ground voltage VSS of the global bit line $GBL_0$ may be transmitted to the first node NA through the first transistor T1 turned on in response to the first sensing signal SEN1 having the logic high level. The ground voltage VSS of the first node NA may be input to the first inverter INV1 so that the second node NB can have a logic high-level signal. The logic high-level signal of the second node NB may be transmitted to the read data line RIO<0> through the fourth transistor T4 turned on or off in response to the read column selection signal RCSL<0>. Thus, the read data line RIO<0> may be at a logic high level. In other words, the read data line RIO<0> also may have a logic high-level signal in accordance with data "1" of the selected memory cell MC.

When data "0" is stored in a selected memory cell MC, the global bit line $GBL_0$ may reach a power supply voltage VDD level. The power supply voltage VDD of the global bit line $GBL_0$ may be transmitted to the first node NA through the first transistor T1 turned on in response to the first sensing signal SEN1 having the logic high level. The power supply voltage VDD of the first node NA may be input to the first inverter INV1 so that the second node NB can have a logic low-level signal. The logic low-level signal of the second node NB may be transmitted to the read data line RIO<0> through the fourth transistor T4 turned on in response to the read column selection signal RCSL<0>. Thus, the read data line RIO<0> may be at a logic low level. In other words, the read data line RIO<0> also may have a logic low-level signal in accordance with data "0" of the selected memory cell MC.

A write operation of the second sense amplifier 40 will now be described. Data transmitted to the write data line WIO<0>, for example, data "1", may be transmitted to the first node NA through the third transistor T3 turned on in response to the write column selection signal WCSL<0>. The logic high-level signal of the first node NA may be transmitted to the global bit line $GBL_0$ through the first inverter INV1, the second inverter INV2, and the second transistor T2 turned on in response to the second sensing signal SEN2. Afterwards, the logic high-level signal of the global bit line $GBL_0$ may be transmitted to the bit line $BL_0$ through the restoration transistor RT turned on or off in response to the restoration signal RES.

The logic high-level signal of the bit line $BL_0$ may be stored in the corresponding memory cell MC in which the word line $WL_0$ is enabled. Thus, data "1" may be stored in the memory cell MC in accordance with data "1" of the write data line WIO<0>.

Data "0" transmitted to the write data line WIO<0> may be transmitted to the first node NA through the third transistor T3 turned on or off in response to the write column selection signal WCSL<0>. The logic low-level signal of the first node NA may be transmitted to the global bit line $GBL_0$ through the first inverter INV1, the second inverter INV2, and the second transistor T2 turned on or off in response to the second sensing signal SEN2. Afterwards, the logic low-level signal of the global bit line $GBL_0$ may be transmitted to the bit line $BL_0$ through the restoration transistor RT turned on or off in response to the restoration signal RES. The logic low-level signal of the bit line $BL_0$ may be stored in the corresponding memory cell MC in which the word line $WL_0$ is enabled. Thus, data "0" may be stored in the memory cell MC in accordance with data "0" of the write data line WIO<0>.

A restoration operation of the second sense amplifier 40 will now be described. When data "1" is stored in the selected memory cell MC, the global bit line $GBL_0$ may be at a ground voltage VSS level due to the above-described sensing operation of the first sense amplifier 20. The ground voltage VSS of the global bit line $GBL_0$ may be transmitted to the first node NA through the first transistor T1 turned on in response to the first sensing signal SEN1 having the logic high level. The ground voltage VSS of the first node NA may be transmitted back to the global bit line $GBL_0$ through the first inverter INV1, the second inverter INV2, and the second transistor T2 turned on or off in response to the second sensing signal SEN2. Afterwards, according to the above-described restoration operation of the first sense amplifier 20, the logic low-level signal of the global bit line $GBL_0$ may be transmitted to the bit line $BL_0$ through the restoration transistor RT turned on in response to the restoration signal RES. Since the word line $WL_0$ of the selected memory cell MC remains enabled, the logic low-level signal of the bit line $BL_0$ may be stored as a logic low-level signal (e.g., data "0") in the selected memory cell MC. The restoration operation may include toggling previous data "1" in the selected memory cell MC and restoring data "0".

When data "0" is stored in the selected memory cell MC, the global bit line $GBL_0$ may be at a power supply voltage VDD level due to the above-described sensing operation of the first sense amplifier 20. The power supply voltage VDD of the global bit line $GBL_0$ may be transmitted to the first node NA through the first transistor T1 turned on in response to the first sensing signal SEN1 having the logic high level. The power supply voltage VDD of the first node NA may be transmitted to the global bit line $GBL_0$ through the first inverter INV1, the second inverter INV2, and the second transistor T2 turned on or off in response to the second sensing signal SEN2. Afterwards, according to the above-described restoration operation of the first sense amplifier 20, a logic high-level signal of the global bit line $GBL_0$ may be transmitted to the bit line $BL_0$ through the restoration transistor RT turned on or off in response to the restoration signal RES. Since the word line $WL_0$ of the selected memory cell MC remains enabled, the logic high-level signal of the bit line $BL_0$ may be stored as a logic high-level signal (e.g., data "1") in the selected memory cell MC. The restoration operation may include toggling previous data "0" of the selected memory cell MC and restoring data "1".

Figure 3:
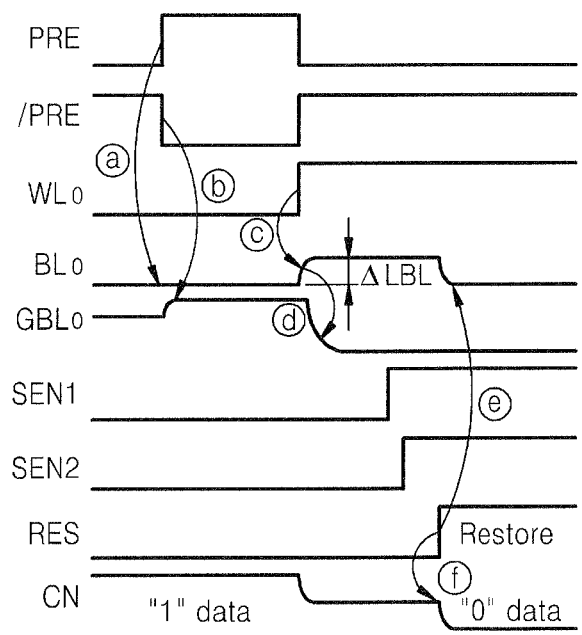
FIGS. 3 and 4 are timing diagrams of an active operation of the semiconductor memory device of FIG. 1, according to an exemplary embodiment of the inventive concept.
Figure 4:
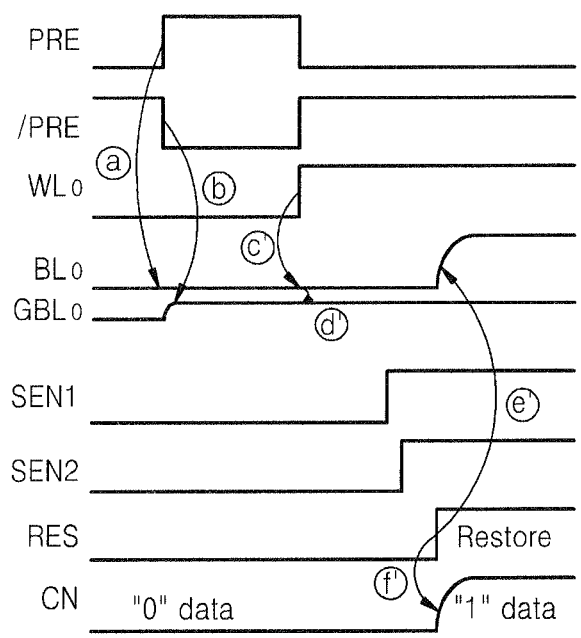

FIGS. 3 and 4 are timing diagrams of the active operation of the semiconductor memory device 1 of FIG. 1, according to an exemplary embodiment of the inventive concept. FIG. 3 shows a case where data "1" is stored in the selected memory cell MC, while FIG. 4 shows a case where data "0" is stored in the selected memory cell MC.

Referring to FIG. 3, the bit line $BL_0$ may be precharged to a ground voltage VSS level in response to a first precharge signal PRE having a logic high level (refer to ⓐ), and the global bit line $GBL_0$ may be precharged to a power supply voltage VDD level in response to a second precharge signal /PRE having a logic low level (refer to (b)). When the word line $WL_0$ of a selected memory cell MC is enabled, charges may be shared between a cell node CN of the selected memory cell MC in which data "1" is stored and the bit line $BL_0$ so that a voltage level of the bit line $BL_0$ may rise by as much as a read signal quantity $\Delta$ LBL (refer to ⓒ). The gain transistor GT may be turned on due to the read signal quantity $\Delta$ LBL of the bit line $BL_0$ so that the global bit line $GBL_0$ can be pulled down to a ground voltage VSS level (refer to ⓓ).

The first and second sensing signals SEN1 and SEN2 may be enabled to a logic high level, the ground voltage VSS of the global bit line $GBL_0$ may be transmitted to the bit line $BL_0$ in response to the restoration signal RES having the logic high level (refer to ⓔ), and the ground voltage VSS (e.g., data "0") may be stored in the cell node CN of the selected memory cell MC (refer to (f)). Thus, it can be seen that the selected memory cell MC may be toggled from previous data "1" to data "0" due to a one-time active operation.

Referring to FIG. 4, the bit line $BL_0$ may be precharged to the ground voltage VSS level in response to the first precharge signal PRE having the logic high level (refer to ⓐ), and the global bit line $GBL_0$ may be precharged to the power supply voltage VDD level in response to the second precharge signal /PRE having the logic low level (refer to (b)). When the word line $WL_0$ of the selected memory cell MC is enabled, the bit line $BL_0$ may be maintained at the precharged ground voltage VSS level (refer to ⓒ') due to the data "0" of the selected memory cell MC. The gain transistor GT may be turned off due to the ground voltage VSS of the bit line $BL_0$ and thus the global bit line $GBL_0$ may be maintained at the precharged power supply voltage VDD level (refer to ⓓ').

The first and second sensing signals SEN1 and SEN2 may be enabled to a logic high level, the power supply voltage VDD of the global bit line $GBL_0$ may be transmitted to the bit line $BL_0$ (refer to (e)') in response to the restoration signal RES having the logic high level, and the power supply voltage VDD (e.g., data "1") may be stored in the cell node CN of the selected memory cell MC (refer to (f)). It can be seen that the selected memory cell MC may be toggled from previous data "0" to data "1" due to a one-time active operation.

Here, when the previous data "0" is stored in the selected memory cell MC, the global bit line $GBL_0$ may remain at the precharged power supply voltage VDD level and make no transition. Thus, it can be seen that current consumption may be reduced during the active operation.

The selected memory cell MC may toggle and restore previously stored data once during each active operation. In other words, data of the selected memory cell MC may be changed each time an active operation is performed. For this reason, it may be necessary to determine whether data currently read from the selected memory cell MC is true data or toggled complementary data. To this end, a semiconductor memory device may adopt parity cells. A semiconductor memory device adopting parity cells will be described as follows with reference to FIG. 5.

Figure 5:
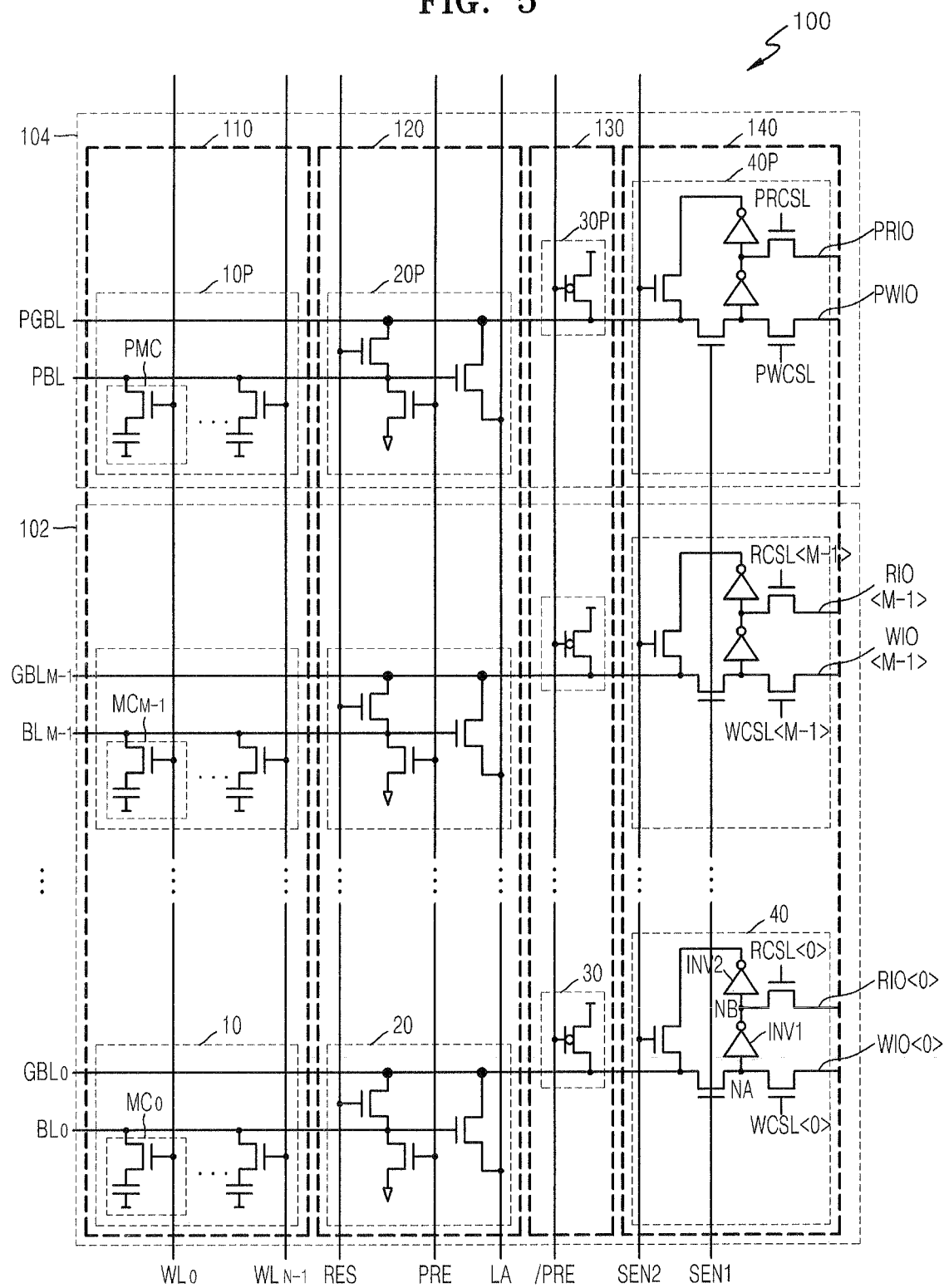
FIG. 5 is a diagram of a semiconductor memory device according to an exemplary embodiment of the inventive concept.

FIG. 5 is a diagram of a semiconductor memory device 100 according to an exemplary embodiment of the inventive concept.

Referring to FIG. 5, the semiconductor memory device 100 may include a main memory block 102 and a parity memory block 104. The main memory block 102 and the parity memory block 104 may include components of the semiconductor memory device 1 described above with reference to FIG. 1.

The main memory block 102 may include a memory cell array 10 connected to each of a plurality of bit lines $BL_0$ to $BL_{M-1}$ (M is a natural number), a first sense amplifier 20, a precharge unit 30, and a second sense amplifier 40. The parity memory block 104 may include a memory cell array 10P connected to one parity bit line PBL, a first sense amplifier 20P, a precharge unit 30P, and a second sense amplifier 40P. The memory cell array 10P, the first sense amplifier 20P, the precharge unit 30P, and the second sense amplifier 40P of the parity memory block 104 may respectively correspond to the memory cell array 10, the first sense amplifier 20, the precharge unit 30, and the second sense amplifier 40 of the main memory block 102.

A plurality of parity cells PMC may be arranged in the memory cell array 10P and connected to intersections between a plurality of word lines $WL_0$ to $WL_{N-1}$ (N is a natural number) and one parity bit line PBL. Like the memory cells MC, each of the parity cells PMC may include a single cell transistor MT and a single cell capacitor CS. The parity bit line PBL of the parity cell PMC may be connected to the first sense amplifier 20P.

The first sense amplifier 20P may precharge the parity bit line PBL to a ground voltage VSS level in response to a first precharge signal PRE during a precharge operation. The first sense amplifier 20P may drive a voltage of a parity global bit line PGBL in response to a read signal quantity $\Delta$ PBL of the parity bit line PBL during a sensing operation. The first sense amplifier 20P may transmit the voltage of the parity global bit line PGBL and restore the voltage in a selected parity cell PMC during a restoration operation.

The precharge unit 30P may precharge the parity global bit line PGBL to a power supply voltage VDD level in response to a second precharge signal /PRE during the precharge operation.

The second sense amplifier 40P may sense the voltage of the parity global bit line PGBL and transmit the voltage to a parity read data line PRIO during a read operation. The second sense amplifier 40P may transmit data provided to a parity write data line PWIO to the parity global bit line PGBL during a write operation. In addition, the second sense amplifier 40P may latch the voltage of the parity global bit line PGBL during the restoration operation.

The parity memory block 104 may write predetermined data, for example, data '1', in the parity cell PMC during an operation of writing data in the memory cell MC of the main memory block 102. Although it is described in the present embodiment that data "1" is written in the parity cell PMC, data "0" may be written in the parity cell PMC.

A data write operation of the semiconductor memory device 100 will now be described. For example, write operations of memory cells $MC_0, \ldots,$ and $MC_{M-1}$ and the parity cell PMC connected to the word line $WL_0$ will be described. Initially, it is assumed that data "0" is written in the memory cell $MC_0$, data "1" is written in the memory cell $MC_{M-1}$, and predetermined data "1" is written in the parity cell PMC. A logic low-level signal corresponding to data "0" may be provided to a write data line WIO<0>, while a logic high-level signal corresponding to data "1" may be provided to a write data line WIO<M−1>. In addition, a logic high-level signal corresponding to data "1" may be provided the parity write data line PWIO.

The logic low-level signal of the write data line WIO<0> may be transmitted to a global bit line $GBL_0$ in response to a write column selection signal WCSL<0> and a first sensing signal SEN1. The logic high-level signal of the write data line WIO<M−1> may be transmitted to a global bit line $GBL_{M-1}$ in response to a write column selection signal WCSL<M−1> and the first sensing signal SEN1. The logic high-level signal of the parity write data line PWIO may be transmitted to the parity global bit line PGBL in response to a parity write column selection signal PWCSL.

In response to a restoration signal RES, the logic low-level signal of the global bit line $GBL_0$ may be connected to the bit line $BL_0$, the logic high-level signal of the global bit line $GBL_{M-1}$ may be connected to the bit line $BL_{M-1}$, and the logic high-level signal of the parity global bit line PGBL may be connected to the parity bit line PBL. When the word line $WL_0$ is enabled, the logic low-level signal of the bit line $BL_0$ may be stored in the memory cell $MC_0$, the logic high-level signal of the bit line $BL_{M-1}$ may be stored in the memory cell $MC_{M-1}$, and the logic high-level signal of the parity bit line PBL may be stored in the parity cell PMC. In other words, during an initial write operation of the semiconductor memory device 100, data "0" may be written in the memory cell $MC_0$, data '1' may be written in the memory cell $MC_{M-1}$, and data "1" may be written in the parity cell PMC.

Subsequently, during an active operation of the semiconductor memory device 100, when the word line $WL_0$ is enabled, the first sense amplifier 20 may perform a sensing operation so that the global bit line $GBL_0$ can be maintained at a power supply voltage VDD level in response to a ground voltage VSS of the bit line $BL_0$ connected to the memory cell $MC_0$. The global bit line $GBL_{M-1}$ may have a ground voltage VSS signal in response to a read signal quantity $\Delta$ LBL of the bit line $BL_{M-1}$ connected to the memory cell $MC_{M-1}$, while the parity global bit line PGBL may have a ground voltage VSS signal in response to a read signal quantity $\Delta$ PBL of the parity bit line PBL connected to the parity cell PMC.

The power supply voltage VDD of the global bit line $GBL_0$ may be transmitted to a first node NA due to a read operation of the second sense amplifier 40, and a voltage of the first node NA may be inverted by a first inverter INV1 and output to a read data line RIO<0>. The read data line RIO<0> may output a ground voltage VSS signal, in other words, a logic low-level signal. The read data line RIO<0> may output a logic low-level signal in accordance with data "0" stored in the memory cell. $MC_0$.

In addition, the global bit line $GBL_0$ having the power supply voltage VDD level may be connected to the bit line $BL_0$ due to a restoration operation of the first sense amplifier 20. The bit line $BL_0$ now having the power supply voltage VDD level may be connected to the corresponding memory cell $MC_0$ so that a power supply voltage VDD signal (e.g., logic high-level signal) can be stored in the memory cell $MC_0$. In other words, initial data "0" may be toggled and data "1" may be restored in the memory cell $MC_0$. Afterwards, when the memory cell $MC_0$ is accessed, the read data line RIO<0> may output a logic high-level signal.

The ground voltage VSS of the global bit line $GBL_{M-1}$ may be transmitted to the first node NA due to a read operation of the second sense amplifier 40, and a voltage of the first node NA may be inverted by the first inverter INV1 and output to a read data line RIO<M−1>. The read data line RIO<M−1> may output a power supply voltage VDD signal (e.g., logic high-level signal). The read data line RIO<M−1> may output a logic high-level signal in accordance with data "1" stored in the memory cell $MC_{M-1}$.

In addition, the global bit line $GBL_{M-1}$ having the ground voltage VSS level may be connected to the bit line $BL_{M-1}$ due to a restoration operation of the first sense amplifier 20. The bit line $BL_{M-1}$ now having the ground voltage VSS level may be connected to the corresponding memory cell $MC_{M-1}$ so that a ground voltage VSS signal, for example, a logic low-level signal, can be stored in the memory cell $MC_{M-1}$. In other words, initial data "1" may be toggled and data "0" may be restored in the memory cell $MC_{M-1}$. Afterwards, when the memory cell $MC_{M-1}$ is accessed, the read data line RIO<M−1> may output a logic low-level signal.

The parity global bit line PGBL having the ground voltage VSS level may be connected to the second sense amplifier 40P, and the second sense amplifier 40P may perform a read operation so that the parity read data line PRIO can output a power supply voltage VDD signal (e.g., logic high-level signal). The parity read data line PRIO may output a logic high-level signal in accordance with data "1" stored in the parity memory cell PMC.

Furthermore, the parity global bit line PGBL having the ground voltage VSS level may be connected to the parity bit line PBL due to a restoration operation of the first sense amplifier 20P. The parity bit line PBL having the ground voltage VSS level may be connected to the corresponding parity cell PMC so that a ground voltage VSS signal (e.g., logic low-level signal) can be stored in the parity cell PMC. In other words, initial data "1" may be toggled and data "0" may be restored in the parity cell PMC. Afterwards, when the parity cell PMC is accessed, the parity read data line PRIO may output a logic low-level signal.

After an initial write operation of the semiconductor memory device 100, during initial active operations of the memory cells $MC_0, \ldots,$ and $MC_{M-1}$ and the parity cell PMC connected to the word line $WL_0$, a logic low-level signal may be output to the read data line RIO<0>, a logic high-level signal may be output to the read data line RIO<M−1>, and a logic high-level signal may be output to the parity read data line PRIO.

Here, since the parity read data line PRIO outputs a logic high-level signal in accordance with data "1" previously determined to be in the parity cell PMC, the semiconductor memory device 100 may determine that data stored in the memory cells $MC_0$ and $MC_{M-1}$ is "true data" of the read data lines RIO<0> and RIO<M−1>. Specifically, the semiconductor memory device 100 may determine that data "0" is stored in the memory cell $MC_0$ based on the logic low-level signal of the read data line RIO<0>, and determine that data "1" is stored in the memory cell $MC_{M-1}$ based on the logic high-level signal of the read data line RIO<M−1>.

During the initial active operations of the memory cells $MC_0, \ldots,$ and $MC_{M-1}$ and the parity cell PMC connected to the word line $WL_0$ of the semiconductor memory device 100, data "1" obtained by toggling the previous data "0" may be restored in the memory cell $MC_{03}$ data "0" obtained by toggling the previous data "1" may be restored in the memory cell $MC_{M-1}$, and data "0" obtained by toggling the previous data "1" may be restored in the parity cell PMC.

Afterwards, during a subsequent active operation of the semiconductor memory device 100, a logic high-level signal may be output to the read data line RIO<0>, a logic low-level signal may be output to the read data line RIO<M−1>, and a logic low-level signal may be output to the parity read data line PRIO.

Here, since the parity read data line PRIO outputs logic low-level data complementary to data "1" previously determined to be in the parity cell PMC, the semiconductor memory device 100 may determine that data stored in the memory cells $MC_0$ and $MC_{M-1}$ is complementary data of the read data lines RIO<0> and RIO<M−1>. Specifically, the semiconductor memory device 100 may determine that data "0" is stored in the memory cell $MC_0$ based on the logic high-level signal of the read data line RIO<0>, and determine that data "1" is stored in the memory cell $MC_{M-1}$ based on the logic low-level signal of the read data line RIO<M−1>.

Accordingly, the semiconductor memory device 100 may adopt the parity cell PMC and read data "0" and "1" stored in the memory cells $MC_0$ and $MC_{M-1}$ without errors.

In the semiconductor memory device 100 of FIG. 5, the memory cell array 10 of the main memory block 102 and the memory cell array 10P of the parity memory block 104 may be disposed in a memory cell array block 110, and the first sense amplifier 20 of the main memory block 102 and the first sense amplifier 20P of the parity memory block 104 may be disposed in a first sense amplifier block 120. In addition, the precharge unit 30 of the main memory block 102 and the precharge unit 30P of the parity memory block 104 may be disposed in a precharge unit block 130, and the second sense amplifier 40 of the main memory block 102 and the second sense amplifier 40P of the parity memory block 104 may be disposed in a second sense amplifier block 140.

Figure 6:
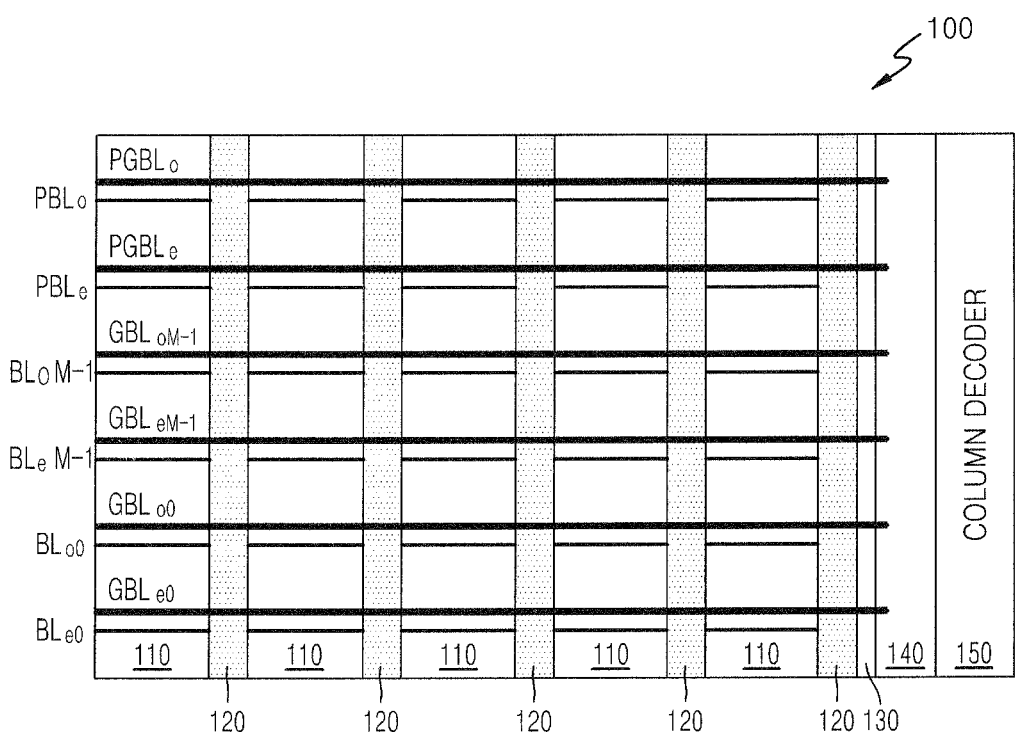
FIG. 6 is a diagram of a hierarchical bit line scheme of the semiconductor memory device of FIG. 5, according to an exemplary embodiment of the inventive concept.

To ensure the quantity of signals read from a memory cell MC, a semiconductor memory device 100 may adopt a hierarchical bit line scheme, according to an exemplary embodiment of the inventive concept, by which a bit line BL is separated from a global bit line GBL, as shown in FIG. 6. Referring to FIG. 6, the memory cell array block 110 and the first sense amplifier block 120 may be alternately disposed in the semiconductor memory device 100. Since a plurality of memory cell array blocks 110 are separated from one another in the semiconductor memory device 100, each of the memory cell array blocks 110 may be referred to as a sub-memory cell array block for brevity.

The precharge unit block 130 and the second sense amplifier block 140 may be disposed in the semiconductor memory device 100 adjacent to the last first sense amplifier block 120. Bit lines $BL_{e0}$, $BL_{o0}$, $BL_{eM-1}$, $BL_{oM-1}$, $PBL_e$, and $PBL_o$ may be disposed in each of the sub-memory cell array blocks 110. Global bit lines $GBL_{e0}$, $GBL_{o0}$, $GBL_{eM-1}$, $GBL_{oM-1}$, $PGBL_e$, and PGBL$_o$ may extend across the sub-memory cell array blocks 110 and the first sense amplifier blocks 120 to the precharge unit block 130 and the second sense amplifier block 140.

The semiconductor memory device 100 may further include a column decoder 150 disposed adjacent to the second sense amplifier block 140. The column decoder 150 may generate write column selection signals WCSL<0:M−1>, read column selection signals RCSL<0:M−1>, a parity write column selection signal PWCSL, and a parity read column selection signal PRCSL and transmit the signals to the second sense amplifier block 140.

The bit lines BL$_{e0}$, BL$_{o0}$, BL$_{eM-1}$, BL$_{oM-1}$, PBL$_e$, and PBL$_o$ may be formed of a conductive material layer, for example, a first metal layer. The global bit lines GBL$_{e0}$, GBL$_{o0}$, GBL$_{eM-1}$, GBL$_{oM-1}$, PGBL$_e$, and PGBL$_o$ may be formed of the same conductive material layer (e.g., the first metal layer) as the bit lines BL$_{e0}$, BL$_{o0}$, BL$_{eM-1}$, BL$_{oM-1}$, PBL$_e$ and PBL$_o$. The bit lines BL$_{e0}$, BL$_{o0}$, BL$_{eM-1}$, BL$_{oM-1}$, PBL$_e$, and PBL$_o$ may have a smaller length than the global bit lines GBL$_{e0}$, GBL$_{o0}$, GBL$_{eM-1}$, GBL$_{oM-1}$, PGBL$_e$, and PGBL$_o$. Thus, a bit line capacitance may be reduced. As a result, the quantity Δ LBL of signals read from the bit lines BL$_{e0}$, BL$_{o0}$, BL$_{eM-1}$, BL$_{oM-1}$, PBL$_e$, and PBL$_o$ may be ensured during a charge sharing operation of a selected memory cell.

The global bit lines GBL$_{e0}$, GBL$_{o0}$, GBL$_{eM-1}$, GBL$_{oM-1}$, PGBL$_e$, and PGBL$_o$ may have a greater length than the bit lines BL$_{e0}$, BL$_{o0}$, BL$_{eM-1}$, BL$_{oM-1}$, PBL$_e$, and PBL$_o$. Thus, a coupling capacitance between adjacent global bit lines GBL$_{e0}$, GBL$_{o0}$, GBL$_{eM-1}$, GBL$_{oM-1}$, PGBL$_e$, and PGBL$_o$ may be high. Due to the coupling capacitance, a voltage level of each of the global bit lines GBL$_{e0}$, GBL$_{o0}$, GBL$_{eM-1}$, GBL$_{oM-1}$, PGBL$_e$, and PGBL$_o$ may be coupled with a voltage level of one of the global bit lines GBL$_{e0}$, GBL$_{o0}$, GBL$_{eM-1}$, GBL$_{oM-1}$, PGBL$_e$, and PGBL$_o$ disposed adjacent thereto, thereby varying the voltage level of the corresponding one of the global bit lines GBL$_{e0}$, GBL$_{o0}$, GBL$_{eM-1}$, GBL$_{oM-1}$, PGBL$_e$, and PGBL$_o$. This may lead to a malfunction in the second sense amplifier block 140 configured to sense the voltage level of the corresponding one of the global bit lines GBL$_{e0}$, GBL$_{o0}$, GBL$_{eM-1}$, GBL$_{oM-1}$, PGBL$_e$, and PGBL$_o$.

To reduce the influence of the coupling capacitance among the global bit lines GBL$_{e0}$, GBL$_{o0}$, GBL$_{eM-1}$, GBL$_{oM-1}$, PGBL$_e$, and PGBL$_o$, the semiconductor memory device 100 may divide the global bit lines GBL$_{e0}$, GBL$_{o0}$, GBL$_{eM-1}$, GBL$_{oM-1}$, PGBL$_e$, and PGBL$_o$ into even global bit lines GBL$_{e0}$, GBL$_{eM-1}$, and PGBL$_e$ and odd global bit lines GBL$_{o0}$, GBL$_{oM-1}$, and PGBL$_o$ to drive the even global bit lines GBL$_{e0}$, GBL$_{eM-1}$, and PGBL$_e$ separately from the odd global bit lines GBL$_{o0}$, GBL$_{oM-1}$, and PGBL$_o$.

To drive the even global bit lines GBL$_{e0}$, GBL$_{eM-1}$, and PGBL$_e$, the column decoder 150 may enable even write column selection signals WCSLe<0:M−1>, even read column selection signals RCSLe<0:M−1>, an even parity write column selection signal PWCSLe, and an even parity read column selection signal PRCSLe. To drive the odd global bit lines GBL$_{o0}$, GBL$_{oM-1}$, and PGBL$_o$, the column decoder 150 may enable odd write column selection signals WCSLo<0:M−1>, odd read column selection signals RCSLo<0:M−1>, an odd parity write column selection signal PWCSLo, and an odd parity read column selection signal PRCSLo.

When the even global bit lines GBL$_{e0}$, GBL$_{eM-1}$, and PGBL$_e$ are driven, undriven odd global bit lines GBL$_{o0}$, GBL$_{oM-1}$, and PGBL$_o$ may serve to shield from a coupling effect caused by the coupling capacitance. When the odd global bit lines GBL$_{o0}$, GBL$_{oM-1}$, and PGBL$_o$ are driven, undriven even global bit lines GBL$_{e0}$, GBL$_{eM-1}$, and PGBL$_e$ may serve to shield the coupling effect caused by the coupling capacitance.

Figure 7:
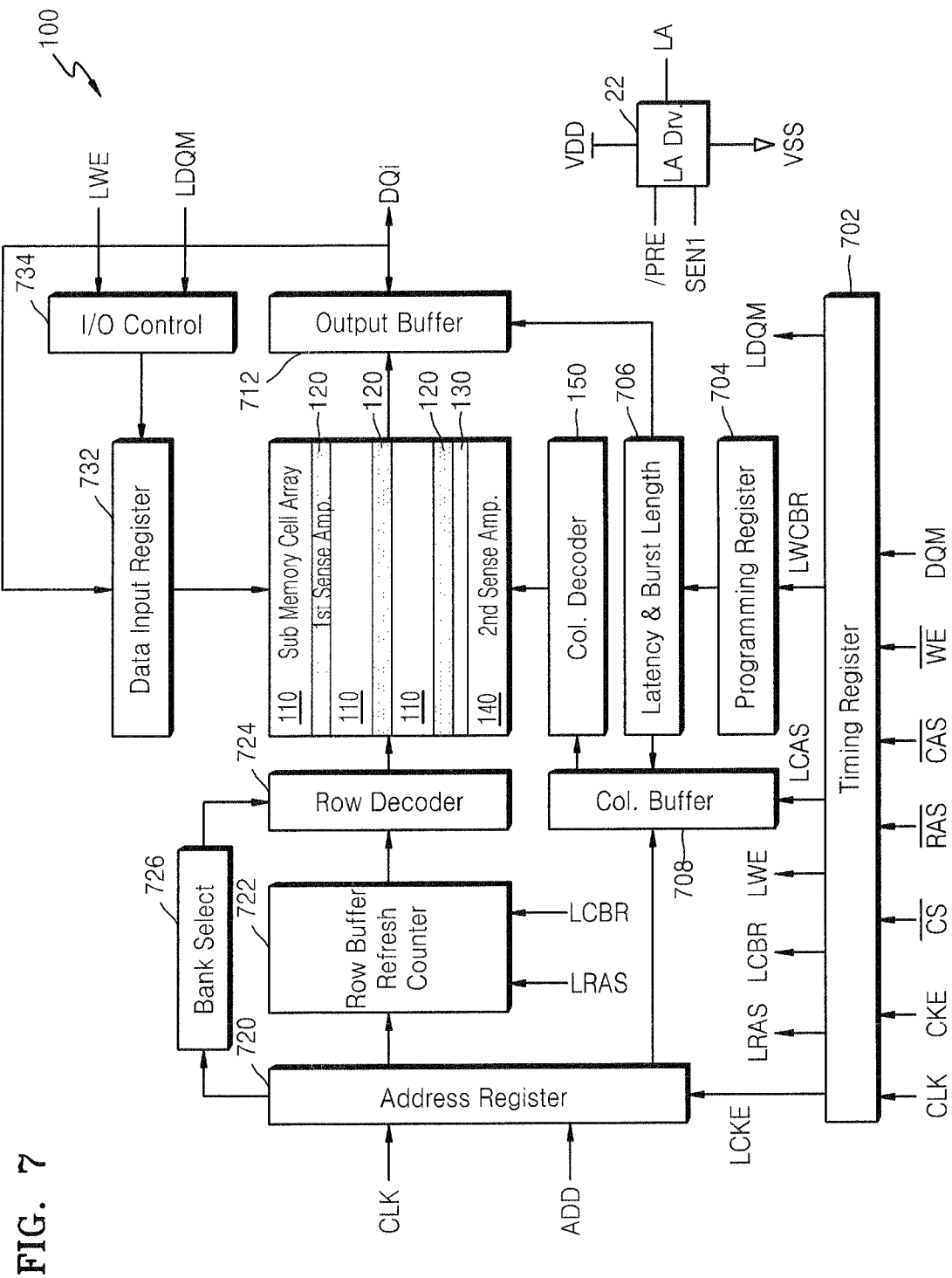
FIG. 7 is a block diagram of circuit blocks included in the semiconductor memory device of FIG. 5, according to an exemplary embodiment of the inventive concept.

The semiconductor memory device 100 described in the embodiments of FIGS. 5 and 6 may further include circuit blocks of FIG. 7. Referring to FIG. 7, the semiconductor memory device 100 may include the sub-memory cell array blocks 110, the first sense amplifier blocks 120, the precharge unit block 130, the second sense amplifier block 140, and the column decoder 150 described with reference to FIG. 6. The semiconductor memory device 100 may include a selective power driver 22 configured to supply different voltages to a selective power supply line LA that provides the voltages to various circuit blocks configured to drive memory cells in certain operating modes.

A timing register 702 may be enabled when a chip selection signal CS is changed from a disenabled level (e.g., a logic high level) to an enabled level (e.g., a logic low level). The timing register 702 may externally receive command signals, such as a clock signal CLK, a clock enable signal CKE, a chip selection signal $\overline{CS}$, a row address strobe signal $\overline{RAS}$, a column address strobe signal $\overline{CAS}$, a write enable signal $\overline{WE}$, and a data input/output (I/O) mask signal DQM, process the received command signals, and generate various internal command signals LCKE, LRAS, LCBR, LWE, LCAS, LWCBR, and LDQM required for controlling circuit blocks.

Some internal command signals generated by the timing register 702 may be stored in a programming register 704. For example, latency information or burst length information associated with output data may be stored in the programming register 704. The internal command signals stored in the programming register 704 may be provided to a latency/burst length controller 706. The latency/burst length controller 706 may provide a control signal required for controlling the latency or burst length of output data to the column decoder 150 or an output buffer 712 through a column address buffer 708.

An address register 720 may externally receive an address signal ADD. A row address signal may be provided through a row address buffer 722 to a row decoder 724. In addition, a column address signal may be provided through the column address buffer 708 to the column decoder 150. The row address buffer 722 may further receive a refresh address signal generated by a refresh counter in response to refresh commands LRAS and LCBR and provide any one of the row address signal and the refresh address signal to the row decoder 724. Furthermore, the address register 720 may provide a bank signal required for selecting a bank to a bank selector 726.

The row decoder 724 may receive the row address signal or refresh address signal from the row address buffer 722, decode the row address signal or refresh address signal, and enable a word line of the sub-memory cell array block 110.

The column decoder 150 may decode the column address signal and select a bit line of the sub-memory cell array block 110. In one example, the column decoder 150 may generate write column selection signals WCSL<0:M−1>, read column selection signals RCSL<0:M−1>, a parity write column selection signal PWCSL, and a parity read column selection signal PRCSL, and transmit the generated signals to the second sense amplifier block 140.

In another example, to drive the even global bit lines GBL$_{e0}$, GBL$_{eM-1}$, and PGBL$_e$, the column decoder 150 may enable even write column selection signals WCSLe<0:M−1>, even read column selection signals RCSLe<0:M−1>, an even parity write column selection signal PWCSLe, and an even parity read column selection signal PRCSLe. In addition, to drive the odd global bit lines $GBL_{oO}$, $GBL_{oM-1}$, and $PGBL_o$, the column decoder 150 may enable odd write column selection signals WCSLo<0:M−1>, odd read column selection signals RCSLo<0:M−1>, an odd parity write column selection signal PWCSLo, and an odd parity read column selection signal PRCSLo.

The first and second sense amplifier blocks 120 and 140 may amplify data of a memory cell selected by the row decoder 724 and the column decoder 150 and transmit the amplified data to the output buffer 712. Data to be written in the memory cell may be transmitted through a data input register 732 to the sub-memory cell array block 110, and an I/O controller 734 may control the operation of transmitting the data using the data input register 732. The selective power driver 22 may apply a voltage having a different voltage level to the selective power supply line LA connected to one terminal of a gain transistor of the first sense amplifier block 120 according to a selection of the memory cell. The selective power supply line LA may receive a power supply voltage VDD during a precharge operation and receive a ground voltage VSS during a sensing operation.

Figure 8:
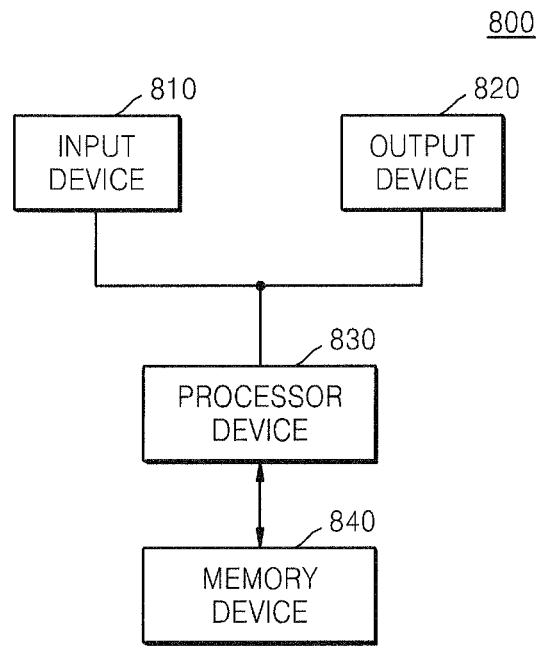
FIG. 8 is a block diagram of an electronic system including a semiconductor memory device according to an exemplary embodiment of the inventive concept.

FIG. 8 is a block diagram of an electronic system 800 including a semiconductor memory device according to an exemplary embodiment of the inventive concept. Referring to FIG. 8, the electronic system 800 may include an input device 810, an output device 820, a processor device 830, and a semiconductor memory device 840. The semiconductor memory device 840 may be a semiconductor memory device according to an exemplary embodiment of the inventive concept described above. The processor device 830 may control each of the input device 810, the output device 820, and the semiconductor device 840 through their corresponding interfaces. The processor device 830 may include a microprocessor (MP), a digital signal processor (DSP), a microcontroller, or logic devices capable of functioning similarly thereto. Each of the input device 810 and the output device 820 may include a keypad, a keyboard, or a display device.

To reduce a bit line capacitance, the semiconductor memory device 840 may adopt a hierarchical bit line scheme in which a bit line is separated from a global bit line. The semiconductor memory device 840 may include a first sense amplifier configured to drive a voltage of the global bit line in response to a voltage level of the bit line and a second sense amplifier configured to sense and amplify the voltage of the global bit line. The first sense amplifier may include three transistors and act as a single-ended sense amplifier in which a voltage of the bit line is input to a gate of one of the three transistors. The first sense amplifier may toggle data stored in a memory cell and restore complementary data in the memory cell during an active operation of the memory cell. The second sense amplifier may sense the voltage of the global bit line and transmit the voltage to a read data line during a read operation, transmit data provided to a write data line to the global bit line during a write operation, and latch the voltage of the global bit line during a restoration operation.

The semiconductor memory device 840 may adopt a parity cell to determine whether data stored in the memory cell is complementary data or true data. During a write operation of the memory cell, predetermined data may be written in the parity cell.

The hierarchical bit line scheme of the semiconductor memory device 840 may include bit lines disposed in sub-memory cell array blocks, first sense amplifier blocks disposed between the sub-memory cell array blocks, global bit lines disposed across the sub-memory cell array blocks and the first sense amplifier blocks, and second sense amplifier blocks configured to sense and amplify voltages of the global bit lines.

The semiconductor memory device 840 may divide the global bit lines into even global bit lines and odd global bit lines and separately drive the even and odd global bit lines to reduce a coupling effect between adjacent global bit lines. In this case, odd parity cells and even parity cells may be disposed in the sub-memory cell array blocks.

Figure 9:
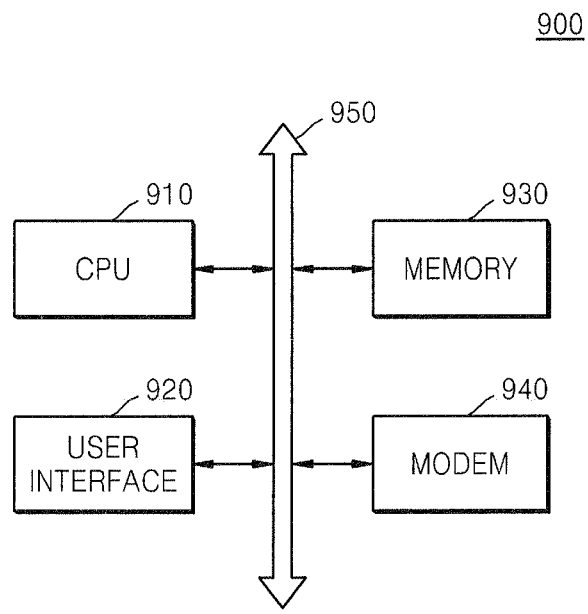
FIG. 9 is a diagram of a computer system including a semiconductor memory device according to an exemplary embodiment of the inventive concept.

FIG. 9 is a diagram of a computer system 900 including a semiconductor memory device according to an exemplary embodiment of the inventive concept. Referring to FIG. 9, the computer system 900 may include a central processing unit (CPU) 910, a user interface 920, a memory 930, and a modem 940, such as a baseband chipset, which may be electrically connected to a system bus 950. The user interface 920 may be an interface by which data may be transmitted to or received from a communication network. The user interface 920 may be a wired/wireless type interface and include an antenna or a wired/wireless transceiver. Data provided through the user interface 920 or the modem 940 or data processed by the CPU 910 may be stored in the memory 930.

The memory 930 may include a volatile memory device, such as a dynamic random access memory (DRAM). In accordance with an exemplary embodiment of the inventive concept described above, the memory 930 may adopt a hierarchical bit line scheme in which a bit line is separated from a global bit line. The memory 930 may include a first sense amplifier configured to drive a voltage of a global bit line in response to a voltage level of a bit line and a second sense amplifier configured to sense and amplify the voltage of the global bit line. The first sense amplifier may include three transistors and act as a single-ended sense amplifier in which a voltage of the bit line is input to a gate of one of the three transistors. The first sense amplifier may toggle data stored in a memory cell and restore complementary data in the memory cell during an active operation of the memory cell. The second sense amplifier may sense the voltage of the global bit line and transmit the voltage to a read data line during a read operation, and latch the voltage of the global bit line during a restoration operation.

The memory 930 may adopt a parity cell to determine whether data stored in the memory cell is complementary data or true data. During a write operation of the memory cell, predetermined data may be written in the parity cell.

The hierarchical bit line scheme of the memory 930 may include bit lines disposed in sub-memory cell array blocks, first sense amplifier blocks disposed between the sub-memory cell array blocks, global bit lines disposed across the sub-memory cell array blocks and the first sense amplifier blocks, and second sense amplifier blocks configured to sense and amplify voltages of the global bit lines.

The memory 930 may divide the global bit lines into even global bit lines and odd global bit lines and separately drive the even and odd global bit lines to reduce a coupling effect between adjacent global bit lines. In this case, odd parity cells and even parity cells may be disposed in the sub-memory cell array blocks.

When the computer system 900 according to an exemplary embodiment of the inventive concept is a mobile apparatus, a battery (not shown) configured to supply an operating voltage to the computer system 900 may be further provided. Although not shown, the computer system 900 according to an exemplary embodiment of the inventive concept may further include an application chipset, a camera image processor (CIP), and an I/O device.

When the computer system 900 according to an exemplary embodiment of the inventive concept is a wireless communication system, the computer system 900 may employ a communication technology, such as code division multiple access (CDMA), global system for mobile communication (GSM), North American digital cellular (NADC), CDMA200 (also known as IMT Multi-Carrier (IMT-MC)), near field communication (NFC), or WiFi.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor memory device, comprising:
a bit line connected to a memory cell; and
a sense amplifier configured to drive a voltage level of a global bit line in response to a voltage level of the bit line,
wherein the sense amplifier provides data that is complementary to data stored in the memory cell to the global bit line and provides the complementary data of the global bit line to the memory cell during an active operation of the memory cell.

2. The device of claim 1, wherein the sense amplifier comprises:
a first transistor having a gate connected to a precharge signal line, a drain connected to the bit line, and a source connected to a first voltage;
a second transistor having a gate connected to the bit line, a drain connected to the global bit line, and a source connected to a selective power supply line; and
a third transistor having a gate connected to a restoration signal line, a drain connected to the bit line, and a source connected to the global bit line.

3. The device of claim 2, wherein the selective power supply line is driven to a second voltage during a precharge operation and driven to the first voltage during a sensing operation.

4. The device of claim 3, wherein the first voltage is a ground voltage, and the second voltage is a power supply voltage.

5. The device of claim 1, further comprising a parity cell connected to a word line of the memory cell.

6. The device of claim 5, further comprising a parity sense amplifier connected to a bit line of the parity cell,
wherein the parity sense amplifier provides data that is complementary to data stored in the parity cell to a parity global bit line and provides the complementary data of the parity global bit line to the parity cell during the active operation of the memory cell.

7. The device of claim 6, wherein the parity cell stores predetermined data during an operation of writing data in the memory cell.

8. The device of claim 7, wherein the semiconductor memory device determines that the data stored in the memory cell is true data when the data stored in the parity cell is the predetermined data and determines that the data stored in the memory cell is the complementary data when the data stored in the parity cell is not the predetermined data.

9. A semiconductor memory device, comprising:
a plurality of sub-memory cell array blocks including a plurality of memory cells arranged at intersections between a plurality of word lines and a plurality of bit lines;
a plurality of first sense amplifier blocks disposed between the sub-memory cell array blocks and including first sense amplifiers configured to drive voltage levels of global bit lines in response to voltage levels of the bit lines of respective sub-memory cell array blocks; and
at least one second sense amplifier block including second sense amplifiers configured to sense and amplify the voltage levels of the global bit lines disposed across the sub-memory cell array blocks and the first sense amplifier blocks,
wherein each of the first sense amplifiers provides data that is complementary to data stored in a respective memory cell to the global bit line of the memory cell and provides the complementary data of the global bit line to the memory cell during an active operation of the memory cell.

10. The device of claim 9, wherein at least one of the sub-memory cell array blocks further includes a parity cell connected to each of the word lines of the memory cells of the sub-memory cell array.

11. The device of claim 10, wherein at least one of the first sense amplifier blocks further includes a first parity sense amplifier connected to a parity bit line of the parity cells and the first sense amplifier block is configured to provide data that is complementary to data stored in a first parity cell of the parity cells to a parity global bit line and provide the complementary data of the parity global bit line to the first parity cell during an access operation of a first memory cell to which the first parity cell is connected, and
the second sense amplifier block further includes a second parity sense amplifier configured to sense and amplify the voltage levels of the parity global bit line disposed across the at least one sub-memory cell array block and the at least one first sense amplifier block.

12. The device of claim 11, wherein the first parity cell stores preset data during an operation of writing data in the first memory cell.

13. The device of claim 12, wherein the semiconductor device determines that the data stored in the first memory cell is true data when the data stored in the parity cell is the preset data, and determines that the data stored in the first memory cell is the complementary data when the data stored in the parity cell is not the preset data.

14. The device of claim 9, wherein the global bit lines are divided into even global bit lines and odd global bit lines to drive the even global bit lines separately from the odd global bit lines.

15. The device of claim 14, wherein at least one of the sub-memory cell array blocks further includes even parity cells connected to each of the word lines of first memory cells in the sub-memory cell array block and odd parity cells connected to each of the word lines of second memory cells in the sub-memory cell array block.

16. The device of claim 9, wherein at least one of the first sense amplifiers comprises:
a first transistor having a gate connected to a precharge signal line, a drain connected to a first bit line of the bit lines, and a source connected to a first voltage;
a second transistor having a gate connected to the first bit line, a drain connected to a first global bit line of the global bit lines, and a source connected to a selective power supply line; and
a third transistor having a gate connected to a restoration signal line, a drain connected to the first bit line, and a source connected to the first global bit line.

17. The device of claim 9, wherein at least one of the second sense amplifiers transmits data provided to a write data line to the global bit line to which the second sense amplifier is connected during a write operation and latches the voltage of the global bit line during a restoration operation.

18. The device of claim 9, wherein at least one of the second sense amplifiers comprises:
a first transistor configured to transmit the voltage of the global bit line to which the second sense amplifier is connected to a first node in response to a first sensing signal;
a first inverter configured to receive the voltage from the first node and output an inverted voltage to a second node;
a second inverter configured to receive the voltage from the second node an output an inverted voltage to a third node; a second transistor configured to transmit the voltage of the third node to the global bit line in response to a second sensing signal;
a third transistor configured to connect the first node and a write data line in response to a write column selection signal; and
a fourth transistor configured to connect the second node and a read data line in response to a read column selection signal.

19. The device of claim 9, further comprising a precharge unit configured to precharge a global bit line to which the precharge unit is connected in response to a precharge signal.

20. A semiconductor memory device, comprising:
a memory cell connected to a bit line and a word line, wherein the bit line is separated from a global bit line; and
a sense amplifier configured to change a voltage level of the global bit line in response to a change in a voltage level of the bit line when the word line is enabled,
wherein the sense amplifier comprises:
a first transistor having a gate connected to a precharge signal line, a drain connected to the bit line, and a source connected to a first voltage;
a second transistor having a gate connected to the bit line, a drain connected to the global bit line, and a source connected to a selective power supply line; and
a third transistor having a gate connected to a restoration signal line, a drain connected to the bit line, and a source connected to the global bit line.

* * * * *